(12) United States Patent
Sasaki et al.

(10) Patent No.: US 9,112,475 B2
(45) Date of Patent: Aug. 18, 2015

(54) EBG STRUCTURE AND CIRCUIT BOARD

(71) Applicant: Kabushiki Kaisha Toshiba, Minato-ku (JP)

(72) Inventors: Tadahiro Sasaki, Tokyo (JP); Kazuhiko Itaya, Kanagawa (JP); Hiroshi Yamada, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 145 days.

(21) Appl. No.: 13/951,875

(22) Filed: Jul. 26, 2013

(65) Prior Publication Data
US 2014/0028412 A1  Jan. 30, 2014

(30) Foreign Application Priority Data

Jul. 27, 2012  (JP) .................................. 2012-167661

(51) Int. Cl.
*H04B 3/28*  (2006.01)
*H03H 7/01*  (2006.01)
*H05K 1/02*  (2006.01)

(52) U.S. Cl.
CPC ........... *H03H 7/0138* (2013.01); *H05K 1/0236* (2013.01); *H01L 2924/0002* (2013.01)

(58) Field of Classification Search
CPC . H05K 1/0236; H05K 1/0225; H05K 1/0227; H01L 2924/0002; H03H 7/0138
USPC .......................................................... 333/12
See application file for complete search history.

(56) References Cited

U.S. PATENT DOCUMENTS 7,136,029 B2 * 11/2006  Ramprasad et al. .......... 343/909
7,215,007 B2    5/2007  McKinzie, III et al.

FOREIGN PATENT DOCUMENTS

JP  2008-147763  6/2008
JP  2009-218966  9/2009

OTHER PUBLICATIONS

Office Action issued on Jul. 29, 2014, in Japanese Patent Application No. 2012-167661 with English translation.
U.S. Appl. No. 14/183,720, filed Feb. 19, 2014, Sasaki, et al.
U.S. Appl. No. 13/677,840, filed Nov. 15, 2012, Tadahiro Sasaki, et al.

* cited by examiner

*Primary Examiner* — Robert Pascal
*Assistant Examiner* — Kimberly Glenn
(74) *Attorney, Agent, or Firm* — Oblon, McClelland, Maier & Neustadt, L.L.P.

(57) ABSTRACT

An EBG (Electromagnetic Band Gap) structure according to an embodiment includes: an electrode that is made of a first conductor; a first insulating layer that is provided on the electrode; a patch unit that is provided in substantially parallel with the electrode on the first insulating layer, the patch unit including a first gap, the patch unit being made of a second conductor; a second insulating layer that is provided on the patch unit; a first via that is provided between the patch unit in the first insulating layer and the electrode and connected to the patch unit and the electrode; and a second via that is provided in the first and second insulating layers, the second via piercing the first gap and being connected to the electrode.

14 Claims, 8 Drawing Sheets

EBG STRUCTURE AND CIRCUIT BOARD

CROSS-REFERENCE TO RELATED APPLICATION

This application is based upon and claims the benefit of priority from Japanese Patent Application No. 2012-167661, filed on Jul. 27, 2012, the entire contents of which are incorporated herein by reference.

FIELD

Embodiments described herein relate generally to an EBG structure and a circuit board.

BACKGROUND

An electromagnetic interference between devices and a noise propagating GND (ground) or a power supply may cause a malfunction in a circuit board, an SOC (system on chip), and a pseudo SOC, on each of which a digital-analog-RF mixed circuit is mounted. In order to avoid the problem, it is necessary to increase a space between the devices. Therefore, a chip area or a mounting area is hardly reduced.

A filter preventing the noise in a frequency domain, which propagates to the GND or the power supply and is harmful to a circuit operation, is used as means for reducing the space. In this case, the filter reducing a noise level of the restricted frequency domain that is of a cutoff band is used. For example, the filter is formed using electronic components such as an inductor chip and a capacitor. Accordingly, it is inevitable to increase the number of electronic components mounted on the circuit board.

Therefore, it has been proposed that an EBG (Electromagnetic Band Gap) structure is provided in an dielectric board, because an effect to reduce the circuit board is enhanced compared with the filter with electronic components. There is a demand to further improve an electromagnetic cutoff characteristic of the EBG structure.

For the EBG structure, in the case that the cutoff band is set to a low-frequency domain (6 GHz or less), unfortunately the EBG structure is enlarged, and the circuit board hardly downsized. Additionally, there is a problem in that a wide stop band is hardly ensured.

On the other hand, an effort to improve the EEC structure is implemented in order to enhance a characteristic of the EBG structure or to reduce a size of the EBG structure.

DETAILED DESCRIPTION

Figure 1A:
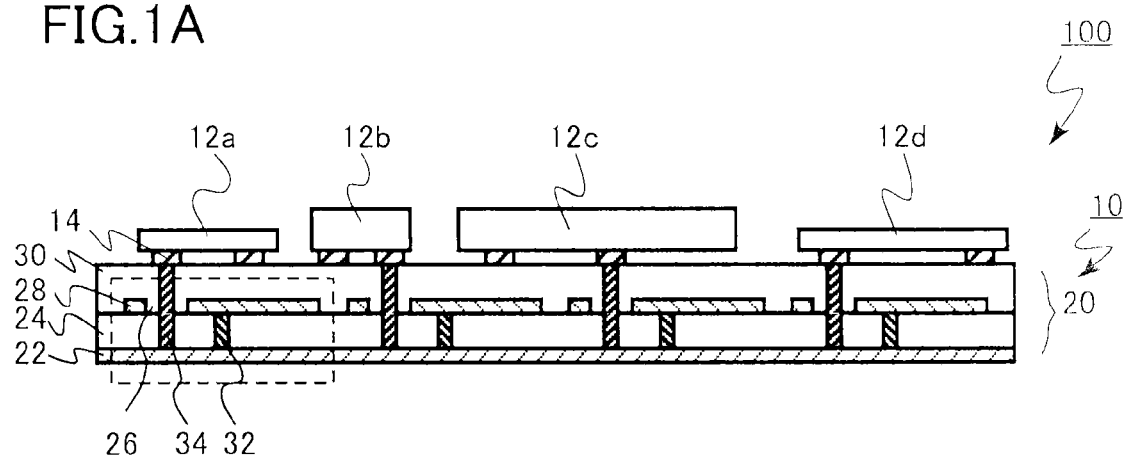
FIGS. 1A and 1B are schematic diagrams illustrating a circuit board according to a first embodiment.

An EBG structure according to an embodiment includes: an electrode that is made of a first conductor; a first insulating layer that is provided on the electrode; a patch unit that is provided in substantially parallel with the electrode on the first insulating layer, the patch unit including a first gap, the patch unit being made of a second conductor; a second insulating layer that is provided on the patch unit; a first via that is provided between the patch unit in the first insulating layer and the electrode and connected to the patch unit and the electrode; and a second via that is provided in the first and second insulating layers, the second via piercing the first gap and being connected to the electrode.

As used herein, a "semiconductor device" is a concept that includes not only a semiconductor chip including an SOC (system on chip) but also a semiconductor component, what is called a pseudo SOC (pseudo system on chip), in which a plurality of semiconductor chips is bonded using resin to connect chips by a wiring layer.

A "semiconductor component" is a concept that includes not only a semiconductor package in which the semiconductor device is sealed but also what is called a bare chip in a state in which the semiconductor device is not sealed.

An "electronic component" is a concept that includes electronically functioning whole components, such as the semiconductor component and such passive components as an antenna, a capacitor, and a resistor.

A "printed wiring board" means a board in which a conductive printed wiring is formed and what is called a bare board on which the electronic component is not mounted.

A "circuit board" means a board in a state in which the electronic component is mounted on the printed wiring board.

A "cutoff band" of the EBG structure is defined by a frequency band in which, for example, S21 that is of an S parameter indicating an insertion loss is less than or equal to −20 dB, namely, a cutoff amount (the insertion loss) is greater than −20 dB.

First Embodiment

An EBG (Electromagnetic Band Gap) structure according to a first embodiment includes: an electrode that is made of a first conductor; a first insulating layer that is provided on the electrode; a patch unit that is provided in substantially parallel with the electrode on the first insulating layer, the patch unit including a first gap, the patch unit being made of a second conductor; a second insulating layer that is provided on the patch unit; a first via that is provided between the patch unit in the first insulating layer and the electrode and connected to the patch unit and the electrode; and a second via that is provided in the first and second insulating layers, the second via piercing the first gap and being connected to the electrode.

A circuit board of the first embodiment includes the EBG structure.

For example, compared with a configuration in which the second via does not pierce the first gap of the patch unit, the EBG structure of the first embodiment including the above configuration can improve a cutoff characteristic against an electromagnetic wave that becomes a noise. The configuration in which the second via pierces the patch unit increases a degree of freedom in forming a transmission route of a ground potential or a power supply potential. Accordingly, downsizing of the circuit board of the semiconductor component can be implemented.

The case that the EBG structure is formed in the printed wiring board constituting the circuit board will be described below by way of example.

Figure 1B:
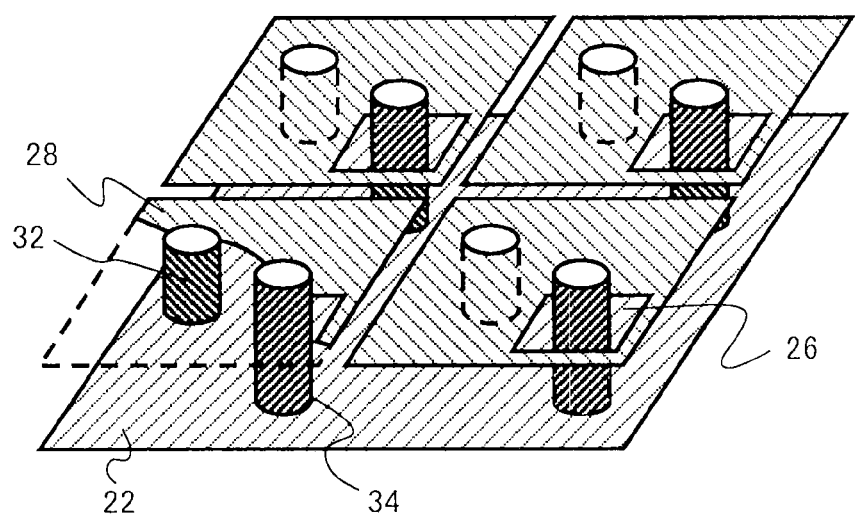

FIGS. 1A and 1B are schematic diagrams illustrating the circuit board of the first embodiment. FIG. 1A is a schematic sectional view of the circuit board, and FIG. 1B is a schematic perspective view of a main part of the EBG structure.

In a circuit board 100, a plurality of electronic components 12a, 12b, 12c, and 12d is mounted on a printed wiring board 10 with bumps 14, for example, interposed therebetween. For example, the electronic components 12a, 12b, 12c, and 12d are semiconductor components such as a logic LSI and a memory or passive components such as a capacitor, a resistor, and a coil. The semiconductor component may be an SOC or a pseudo SOC.

An EBG structure 20 is formed in the printed wiring board 10. The EBG structure 20 includes: an electrode 22 that is made of a first conductor; a first insulating layer 24 that is provided on the electrode 22; a patch unit 28 that is provided in substantially parallel with the electrode 22 on the first insulating layer 24, the patch unit 28 including a first gap 26, the patch unit 28 being made of a second conductor; a second insulating layer 30 that is provided on the patch unit 28; a first via 32 that is provided between the patch unit 28 in the first insulating layer 24 and the electrode 22 and connected to the patch unit 28 and the electrode 22; and a second via 34 that is provided in the first and second insulating layers 24 and 30, the second via 34 piercing the first gap 26 and being connected to the electrode 22.

In FIG. 1A, a region surrounded by a dotted line constitutes one unit of the EBG structure 20. The EBG structure 20 has a configuration in which the units are regularly or periodically disposed. The EBG structure of the first embodiment is what is called a mushroom structure.

For example, the electrode 22 is a ground surface or a ground line. The electrode 22 may be a power supply surface or a power supply line. The electrode 22 is what is called a reference surface. For example, the first conductor is metals such as aluminum (Al) or gold (Au).

For example, the first insulating layer 24 is made of resin.

The patch unit 28 is made of the second conductor. For example, the second conductor is metals such as aluminum (Al) or gold (Au). There is no particular limitation to a shape of the patch unit 28, but the patch unit 28 may be formed into a square shape, a circular shape, or other shapes.

A size of the patch unit 28 is optimized in order to obtain a desired cutoff band (stop band region). From the viewpoint of reducing the size of the circuit board, desirably the size of the patch unit 28 is less than or equal to 10 mm squares.

The first gap (or a hole or a space) 26 is provided in the patch unit 28. There is no particular limitation to the shape of the first gap 26, but the first gap 26 may be formed into the square shape, the circular shape, or other shapes.

For example, the second insulating layer 30 is made of resin.

Each of the first via 32 and the second via 34 is made of a conductor. There is no particular limitation to the conductor, the conductor may be metal, semiconductor, or conductive resin.

The first via 32 is provided between the patch unit 28 in the first insulating layer 24 and the electrode 22, and connected to the patch unit 28 and the electrode 22. On the other hand, the second via 34 is provided in the first insulating layer 24 and the second insulating layer 30.

The second via 34 pierces the first gap 26 of the patch unit 28, and is connected to the electrode 22. The second vias 34 are electrically connected to the electronic components 12a to 12d mounted on the printed wiring board 10 while the bumps 14 are interposed between the second vias 34 and the electronic components 12a to 12d, and the second via 34 acts as wiring through which the ground potential or the power supply potential is supplied.

Figure 2:
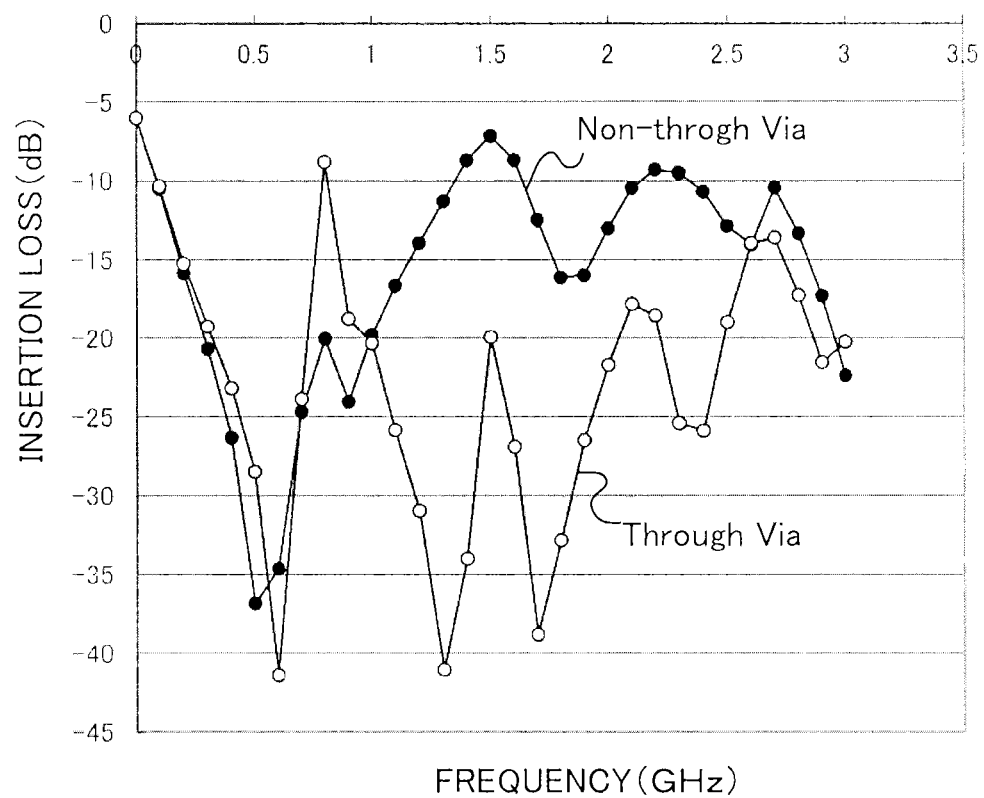
FIG. 2 is a view illustrating an electromagnetic analysis result of the first embodiment.
Figure 3A:
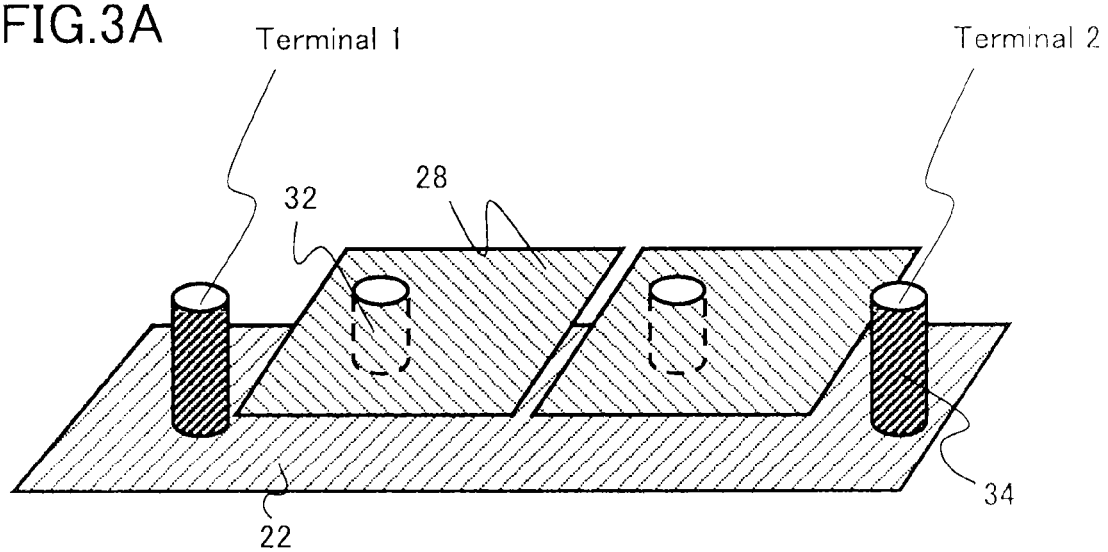
FIGS. 3A and 3B are schematic diagrams illustrating an EBG structure used in a simulation of the first embodiment.
Figure 3B:
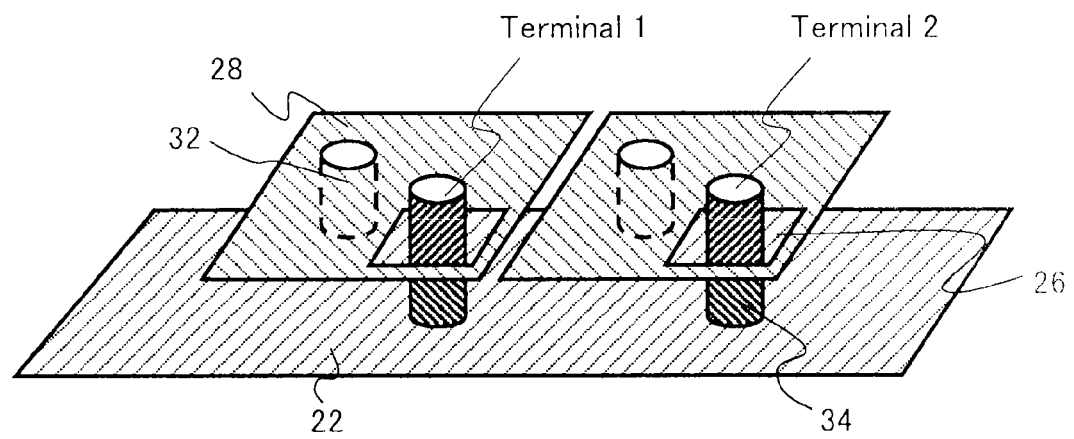

FIG. 2 is a view illustrating an electromagnetic analysis result of the first embodiment. The analysis is performed by a simulation. FIGS. 3A and 3B are schematic diagrams illustrating an EBG structure used in the simulation. FIG. 3A illustrates a structure (non-through via) in which the second via 34 does not pierce or go through the patch unit 28, and FIG. 3B illustrates a structure (through via) in which the second via 34 pierces or go through the patch unit 28.

In each case, a dependence property of a signal passing through a terminal 2 on a frequency is estimated when the signal is input from a terminal 1. In FIG. 2, a horizontal axis indicates the frequency of a transmission signal, and a vertical axis indicates an insertion loss (S21 parameter). A black circle in FIG. 2 indicates a cutoff characteristic of the structure in which the second via 34 does not pierce the patch unit 28, and a white circle indicates a cutoff characteristic of the structure in which the second via 34 pierces the patch unit 28.

As is clear from FIG. 2, in the structure in which the second via 34 pierces the patch unit 28, a width of a cutoff band is widened with increasing insertion loss. According to the EBG structure 20 of the first embodiment, the cutoff characteristic against the electromagnetic wave can be improved.

This is attributed to the following fact. That is, the current passes through the first gap 26 provided in the patch unit 28, whereby a TEM (Transverse Electric Wave) caused by the current vertically passing through the second via 34 is efficiently cut off by the patch unit 28.

In the first embodiment, because of the structure in which the second via 34 pierces the patch unit 28, a degree of routing freedom of the ground line or the power supply line increases when the EBG structure 20 is provided. For example, it is assumed that the second via 34 that constitutes the ground line or the power supply line needs to be provided while going around the patch unit 28 of the EBG structure 20. A region necessary for the routing of the ground line or the power supply line increases to enlarge an area of the circuit board. Possibly a resistance increase caused by the routing of the ground line or the power supply line causes instability of the ground potential or the power supply potential.

According to the first embodiment, because of the structure in which the second via 34 pierces the patch unit 28, the ground line or the power supply line can be routed by the shortest cut. Accordingly, the EBG structure of the first embodiment contributes to downsizing of the circuit board and stabilization of the ground potential or the power supply potential.

In the first embodiment, by way of example, the EBG structure is formed in the printed wiring board constituting the circuit board. Alternatively, for example, the EBG structure may be formed in the semiconductor component such as the pseudo SOC and the SOC while being integral with the semiconductor device.

In the first embodiment, by way of example, the one first gap 26 is provided in the one patch unit 28. Alternatively, for example, at least two first gaps 26 may be provided in the one patch unit 28 and a plurality of second vias 34 may pierce the gaps.

In the first embodiment, by way of example, the plurality of patch units 28 is periodically arrayed. Alternatively, the one patch unit 28 may be disposed or the plurality of patch units 28 may irregularly be arrayed.

Second Embodiment

An EBG structure according to a second embodiment differs from the EBG structure of the first embodiment in that the electrode includes a second gap (or a hole or a space) in a region immediately below the patch unit. Accordingly, the description overlapping the first embodiment is omitted.

Figure 4A:
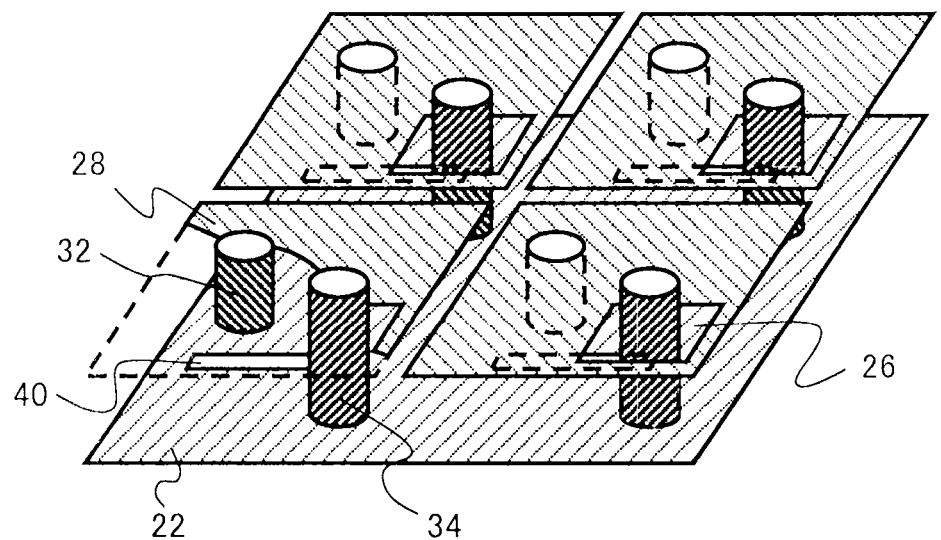
FIGS. 4A and 4B are schematic perspective views illustrating a main part of an EBG structure according to a second embodiment.
Figure 4B:
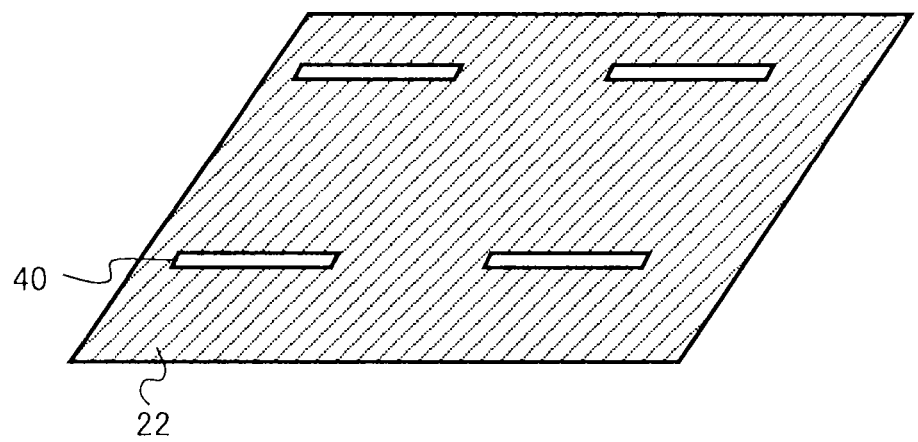

FIGS. 4A and 4B are schematic perspective views illustrating a main part of the EBG structure of the second embodiment. FIG. 4A is an overall view, and FIG. 4B is a view illustrating only the electrode.

As illustrated in FIGS. 4A and 4B, in the EBG structure of the second embodiment, the electrode 22 includes a slit-like second gap 40 in the region immediately below the patch unit 28. As used herein, the region immediately below the patch unit 28 means a region where the patch unit 28 is projected on a surface of the electrode 22 in a direction normal to the surface of the electrode 22. The second gap 40 may have periodical pattern.

According to the second embodiment, a noise in a low-frequency band near, for example, 1 GHz can be cut off while a size of the patch unit 28 or the length of the first via are controlled in the EBG structure.

Figure 5:
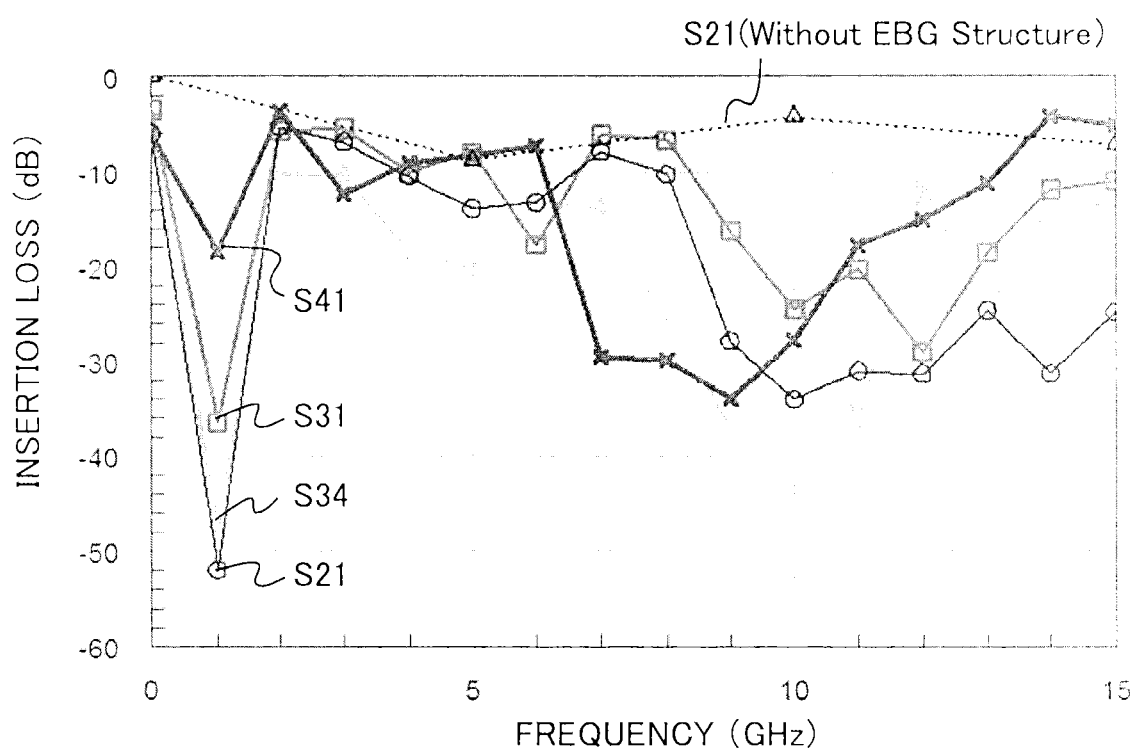
FIG. 5 is a view illustrating an electromagnetic analysis result of the second embodiment.
Figure 6A:
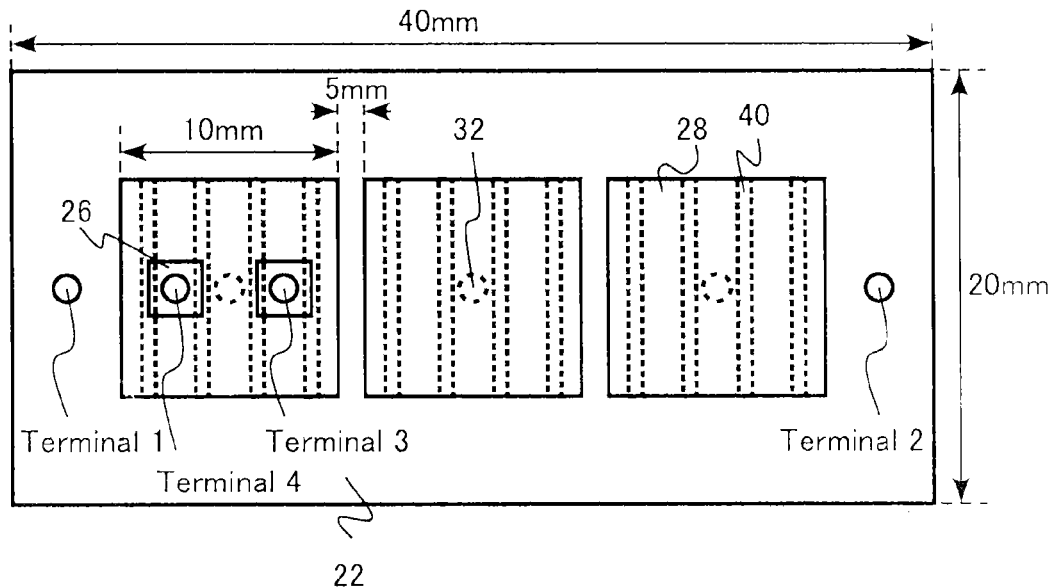
FIGS. 6A to 6C are schematic diagrams illustrating an BEG structure used in a simulation of the second embodiment.
Figure 6B:
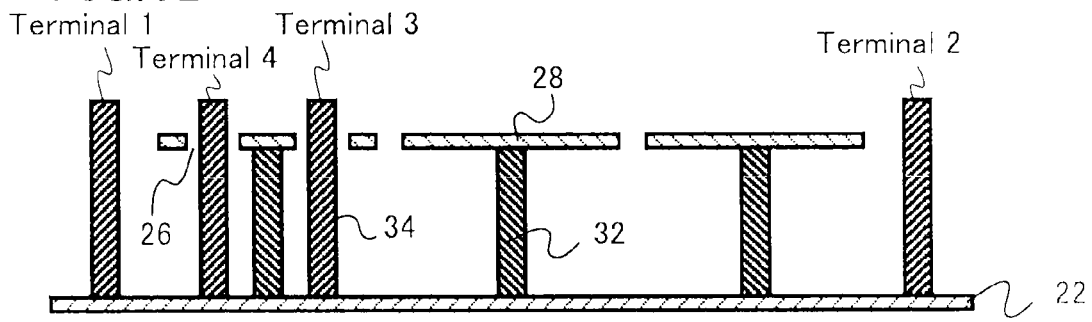
Figure 6C:
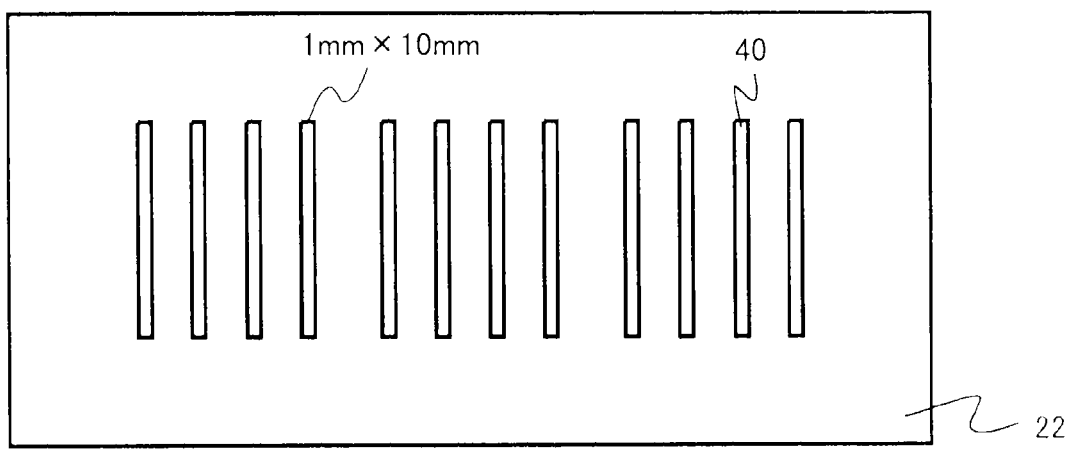

FIG. 5 is a view illustrating an electromagnetic analysis result of the second embodiment. The analysis is performed by the simulation. FIGS. 6A to 6C are schematic diagrams illustrating an EBG structure used in the simulation. FIG. 6A is a plan view of the EBG structure, FIG. 6B is a sectional view of the EBG structure, and FIG. 6C is a view illustrating a pattern of the second gap of the electrode.

The electrode 22 has the size of 40 mm×20 mm, the metallic patch unit 28 has the size of 10 mm×10 mm, and the first via 32 has the length of 0.8 mm. The three patch units 28 are disposed at an interval of 0.5 mm. The slit having the size of 1 mm×10 mm is provided as the second gap 40 in the region immediately below the patch unit 28 of the electrode 22. The second gap 40 may have periodical pattern shown in FIG. 6C.

The dependence property of the frequency on the insertion loss (S21) of the signal passing through the terminal 2 is estimated when the signal is input from the terminal 1. Similarly, an insertion loss (S34) between a terminal 4 and a terminal 3, an insertion loss (S31) between the terminal 1 and the terminal 3, and an insertion loss (S41) between the terminal 1 and the terminal 4 are estimated. An S21 characteristic of the case that the EBG structure does not exist is also estimated, and illustrated in FIG. 5.

In FIG. 5, the horizontal axis indicates the frequency of the transmission signal, and the vertical axis indicates the insertion loss. In each case, the low-frequency electromagnetic wave of 1 GHz can be cut off. Particularly, it is found that a cutoff amount is increased compared with the case that both the two second vias 34 constituting the terminals pierce the patch unit 28 (S34) and the case that a distance between the terminals is increased (S31).

In the second embodiment, the cutoff characteristic of the low frequency of 1 GHz is implemented by the relatively-small-size EBG structure in which the patch unit 28 has the size of 10 mm×10 mm and the first via 32 has the length of 0.8 mm. This is attributed to the fact that capacitance coupling between the patch unit 28 and the electrode 22 is reduced by providing the second gap 40 in the electrode 22. The structure in which the second via 34 pierces the patch unit 28 can cut off the TEM wave from the second via 34 and increase the cutoff amount (insertion loss).

Figure 7:
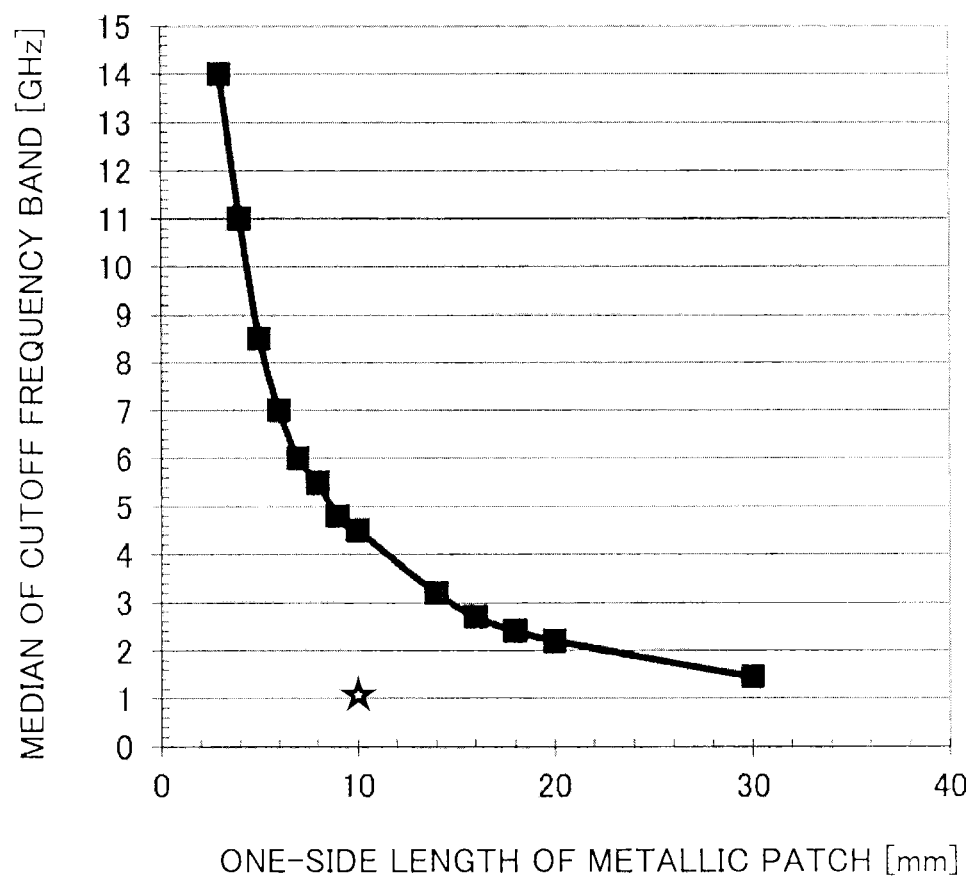
FIG. 7 is a view illustrating a relationship between one-side length of a metallic patch unit and a cutoff frequency.

FIG. 7 is a view illustrating a relationship between a one-side length of the metallic patch unit and a cutoff frequency. A cutoff frequency is estimated with a one-side length of a square patch unit as a parameter without providing the second gap 40 in the electrode 22 and without piercing the second via 34 in the patch unit 28. The estimation is performed on a condition that the first via length is less than or equal to 1 mm.

In FIG. 7, the horizontal axis indicates the one-side length of the metallic patch unit, and the vertical axis indicates a median of the cutoff frequency band. As is clear from FIG. 7, the cutoff frequency decreases when the patch unit 28 is enlarged, but the cutoff frequency does not reach the median of 1 GHz even in the patch unit having the size of 30 mm squares. In consideration of the downsizing of the circuit board, it is hardly to say that the patch unit having the size of 30 mm squares is a useful size.

In FIG. 7, a star sign (☆) indicates the characteristic that can be implemented in the second embodiment. According to the second embodiment, it is found that the frequency of 1 GHz can be cut off by the small-size EBG structure.

The shape of the second gap 40 is not limited to the slit shape, but the second gap 40 may be formed into an L-shape, the square shape, the circular shape, or other shapes.

Desirably the distance between the second gaps 40 is ½, ¼, or ⅛ of a wavelength corresponding to the frequency to be cut off.

However, the distance between the second gaps 40 may be randomly set, or set to a value except ½, ¼, or ⅛ of the wavelength corresponding to the frequency to be cut off.

Third Embodiment

In a circuit board according to a third embodiment, a plurality of circuit blocks is formed including different functions by mounting a plurality of electronic components on the circuit board. The second via that pierces the patch unit is connected to the different circuit block. The description overlapping the first or second embodiment is omitted.

Figure 8A:
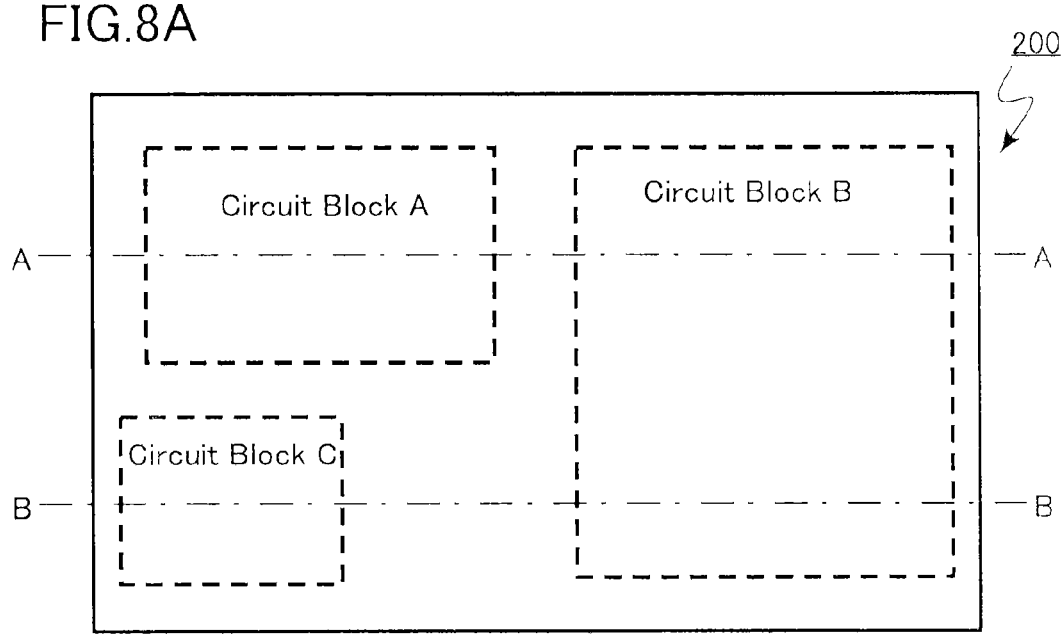
FIGS. 8A to 8C are schematic diagrams illustrating a circuit board according to a third embodiment.
Figure 8B:
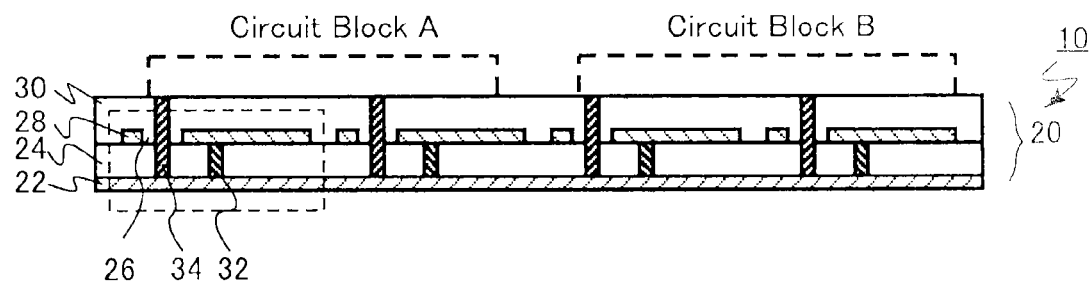
Figure 8C:
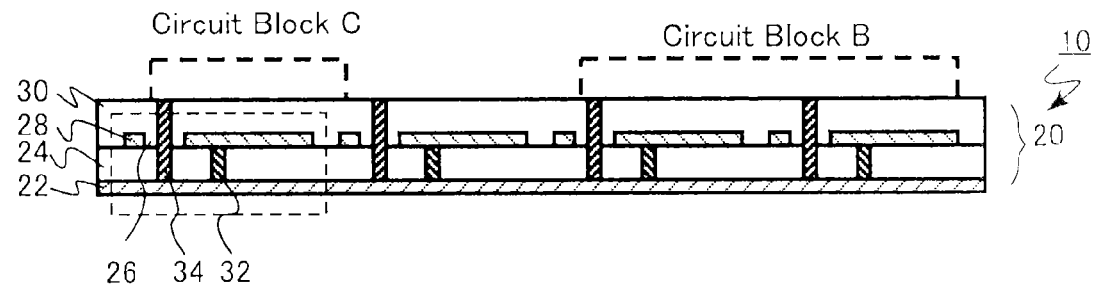

FIGS. 8A to 8C are schematic diagrams illustrating the circuit board of the third embodiment. FIG. 8A is a plan view of the circuit board, FIG. 8B is a sectional view taken on a line A-A of FIG. 8A, and FIG. 8C is a sectional view taken on a line B-B of FIG. 8A.

In a circuit board 200 of the third embodiment, the plurality of circuit blocks, such as a circuit block A, a circuit block B, and a circuit block C, which include different functions by mounting the plurality of electronic components. For example, the circuit block A is a digital circuit, the circuit block B is an analog circuit, and the circuit block C is an RF circuit.

The circuit block may be a set of a plurality of electronic components or a single electronic component such as the SOC and the pseudo SOC.

As illustrated in FIGS. 8B and 8C, a second via 34 that pierce different patch unit 28 is connected to different circuit block. The EBG structure 20 formed in the printed wiring board 10 is the EBG structure of the first or second embodiment.

Isolation of the ground or the power supply can be enhanced in each circuit block by connecting the second via 34 that pierces the patch unit 28 to the different circuit block. Accordingly, the stability of the ground or the power supply of each circuit block is improved to prevent a malfunction of the circuit board.

While certain embodiments have been described, these embodiments have been presented by way of example only, and are not intended to limit the scope of the inventions.

Indeed, the EBG structure and the circuit board described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An EBG (Electromagnetic Band Gap) structure comprising:
    an electrode made of a first conductor;
    a first insulating layer provided on the electrode;
    a patch unit provided in substantially parallel with the electrode on the first insulating layer, the patch unit including a first gap, the patch unit being made of a second conductor;
    a second insulating layer provided on the patch unit;
    a first via provided between the patch unit and the electrode, the first via provided in the first insulating layer, and the first via connected to the patch unit and the electrode; and
    a second via provided in the first and second insulating layers, the second via piercing the first gap and being connected to the electrode;
    wherein the electrode includes a second gap in a region immediately below the patch unit.

2. The EBG structure according to claim 1, wherein the electrode is one of a ground surface, a ground line, a power supply surface, and a power supply line.

3. The EBG structure according to claim 1, wherein the second gap has periodical pattern.

4. The EBG structure according to claim 1, wherein the first conductor is one of aluminum (Al) and gold (Au), and the second conductor is one of aluminum (Al) and gold (Au).

5. An EBG (Electromagnetic Band Gap) structure comprising:
    an electrode made of a first conductor;
    a first insulating layer provided on the electrode;
    patch units provided in substantially parallel with the electrode on the first insulating layer, the patch units being periodically disposed, each of the patch units including a first gap, each of the patch units being made of a second conductor;
    a second insulating layer provided on the patch units;
    first vias provided between the patch units and the electrode, the first vias provided in the first insulating layer, and each of the first vias connected to each of the patch units and the electrode; and
    second vias provided in the first and second insulating layers, each of the second vias piercing the first gap and being connected to the electrode;
    wherein the electrode includes second gaps in a region immediately below the patch units.

6. The EBG structure according to claim 5, wherein the electrode is one of a ground surface, a ground line, a power supply surface, and a power supply line.

7. The EBG structure according to claim 5, wherein the second gaps are periodically disposed.

8. The EBG structure according to claim 5, wherein the first conductor is one of aluminum (Al) and gold (Au), and the second conductor is one of aluminum (Al) and gold (Au).

9. A circuit board on which a plurality of electronic components is mounted, the circuit board comprising an EBG (Electromagnetic Band Gap) structure, the EBG structure including:
    an electrode made of a first conductor;
    a first insulating layer provided on the electrode;
    patch units provided in substantially parallel with the electrode on the first insulating layer, each of the patch units including a first gap, each of the patch units being made of a second conductor;
    a second insulating layer provided on the patch unit;
    first vias provided between the patch units and the electrode, the first vias provided in the first insulating layer, and each of the first vias connected to each of the patch units and the electrode; and
    second vias provided in the first and second insulating layers, each of the second vias piercing the first gap and being connected to the electrode,
    wherein the electrode includes second gaps in a region immediately below the patch units.

10. The circuit board according to claim 9, wherein the electrode is one of a ground surface, a ground line, a power supply surface, and a power supply line.

11. The circuit board according to claim 9, wherein the second gaps are periodically disposed.

12. The circuit board according to claim 9, wherein the first conductor is one of aluminum (Al) and gold (Au), and the second conductor is one of aluminum (Al) and gold (Au).

13. The circuit board according to claim 9, wherein a plurality of circuit blocks having different functions are formed in the circuit board by mounting the plurality of electronic components, and the second via pierce different patch unit is connected to different circuit block.

14. The circuit board according to claim 9, wherein the patch units are periodically disposed.

* * * * *